United States Patent [19]

Ikeda

[11] Patent Number: 5,636,151
[45] Date of Patent: Jun. 3, 1997

[54] ADAPTIVE FILTER CAPABLE OF REMOVING A RESIDUAL ECHO AT A RAPID SPEED

[75] Inventor: Shigeji Ikeda, Tokyo, Japan

[73] Assignee: NEC Corporation, Tokyo, Japan

[21] Appl. No.: 490,859

[22] Filed: Jun. 15, 1995

[30] Foreign Application Priority Data

Jun. 15, 1994 [JP] Japan .................................. 6-156518

[51] Int. Cl.⁶ .................................................. G06F 17/00
[52] U.S. Cl. ................................ 364/724.19; 364/724.16; 364/724.2
[58] Field of Search ........................... 364/724.01, 724.16, 364/724.19, 724.2; 370/32.1; 375/230, 232, 233; 379/410, 411

[56] References Cited

U.S. PATENT DOCUMENTS

| | | | |
|---|---|---|---|
| 4,805,215 | 2/1989 | Miller | 379/411 |
| 5,218,560 | 6/1993 | Ikeda et al. | 364/724.19 |
| 5,245,561 | 9/1993 | Sugiyama | 364/724.19 |
| 5,455,819 | 10/1995 | Sugiyama | 370/13 |

FOREIGN PATENT DOCUMENTS

0492647A2   7/1992   European Pat. Off. .

OTHER PUBLICATIONS

Spring Conference of The Institute of Electronics, Information and Communication, 1993, pp. 1–181, Shigeji IKEDA et al.: "A Fast Algorithm for Adaptive FIR Filters with Adaptive Tap Location Based on Transition–Timing Control of Tap–Index Subgroups." (unknown month).

*Primary Examiner*—Chuong D. Ngo
*Attorney, Agent, or Firm*—Sughrue, Mion, Zinn, Macpeak & Seas

[57] ABSTRACT

In an adaptive filter, each of first through N-th taps belongs to either one of first through M-th tap groups. A first generating section (31) generates a specific one of the first through the M-th tap groups. A second generating section (32 to 34, 37, 38) generates a tap select signal in accordance with first through K-th tap gains and the specific tap group, where a positive integer K is less than a positive integer N. By the tap select signal, a tap select section (22) connects first through K-th selected taps to a filter section (20-1 to 20-(N–1), to 24-1 to 24-K, 25-1 to 25-K, 26, 27). A control section (40, 41, 52, 53) is responsive to the tap select signal for controlling the first generating section to make the first generating section generate a renewal one of the first through the M-th tap groups as the specific tap group.

10 Claims, 3 Drawing Sheets

ADAPTIVE FILTER CAPABLE OF REMOVING A RESIDUAL ECHO AT A RAPID SPEED

Background of the Invention

This invention relates to an adaptive filter for filtering a received signal into a filtered signal in accordance with controllable tap gains.

A conventional adaptive filter has first through N-th taps and is supplied with a received signal through a transmission path to filter the received signal into a filtered signal in accordance with first through N-th controllable tap gains, where N represents a positive integer which is not less than one. The adaptive filter may be one of an echo canceller, a howling canceller, and an adaptive equalizer.

The received signal may be received through an input path at the adaptive filter. When taking a delay time of the input path into consideration, it is necessary to make the positive integer N be very large in order to filter the received signal into the filtered signal as desired. Therefore, it is practically difficult to filter the received signal into the filtered signal because the conventional adaptive filter uses the first through the N-th controllable tap gains.

In order to practically filter the received signal into the filtered signal, an improved adaptive filter is disclosed in "A Fast Algorithm for Adaptive FIR Filters with Adaptive Tap Location Based on Transition-Timing Control of Tap-Index Subgroups" which is published in Spring Conference of The Institute of Electronics, Information and Communication Engineers in 1993. The improved adaptive filter comprises first through N-th taps and a filter section for filtering the received signal into the filtered signal in accordance with first through K-th controllable tap gains, where K represents a positive integer which is less than the positive integer N.

The improved adaptive filter further comprises a tap selecting section for selecting selected ones of the first through the N-th taps as first through K-th selected taps in accordance with a tap select signal to connect to the first through K-th selected taps to the filtering section and a producing section for producing the tap select signal in accordance with the first through the K-th controllable tap gains.

However, it is difficult to filter the received signal into the filter signal at a rapid speed in the improved adaptive filter as will later be described. Namely, it is difficult to remove a residual echo in a rapid speed.

SUMMARY OF THE INVENTION

It is therefore an object of this invention to provide an adaptive filter capable of filtering a received signal into a filtered signal at a rapid speed.

Other objects of this invention will become clear as the description proceeds.

On describing the gist of this invention, it is possible to understand that an adaptive filter comprises first through N-th taps, where N represents a positive integer which is not less than one, filter means for filtering a received signal into a filtered signal in accordance with first through K-th controllable tap gains, where K represents a positive integer which is less than the positive integer N, tap selecting means for selecting selected ones of the first through the N-th taps as first through K-th selected taps in accordance with a tap select signal to connect the first through the K-th selected taps to the filter means, and producing means for producing the tap select signal in accordance with the first through the K-th controllable tap gains.

According to this invention, each of the first through the N-th taps belongs to either one of first through M-th tap groups, where M represents a positive integer which is less than the positive integer N. The producing means comprises first generating means for generating a specific one of the first through the M-th tap groups, second generating means for generating the tap select signal in accordance with the first through the K-th controllable tap gains and the specific tap group, and control means responsive to the tap select signal for controlling the first generating means to make the first generating means generate a renewal one of the first through the M-th tap groups as the specific tap group.

DESCRIPTION OF THE PREFERRED EMBODIMENT

Figure 1:
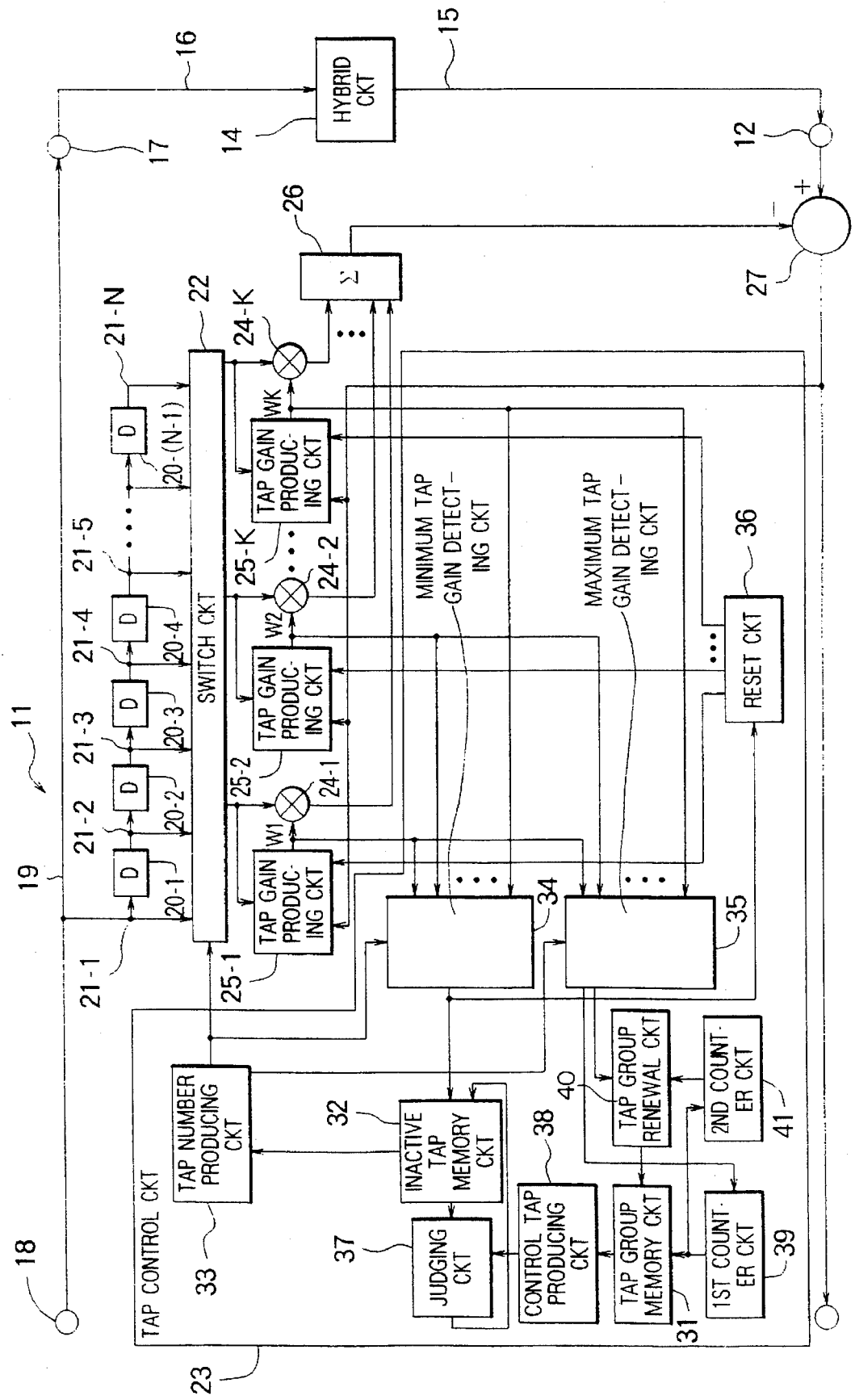
FIG. 1 is a block diagram of a conventional adaptive filter.

Referring to FIG. 1, description will first be made as regards a conventional adaptive filter for a better understanding of this invention. The adaptive filter may be one of an echo canceller, a howling canceller, and an adaptive equalizer. In the example being illustrated, the adaptive filter is used as the echo canceller and will be designated by a reference numeral 11. The echo canceller 11 has input and output terminals 12 and 13. The input terminal 12 is connected to a hybrid circuit 14 through an input path 15. The hybrid circuit 14 is connected to a transmission path 16 which is connected to a transmission terminal 17. Furthermore, the transmission terminal 17 is connected to a reception terminal 18 through a reception path 19.

A transmitted signal is supplied to the reception terminal 18 as a received signal through a propagation path (not shown). The transmitted signal may be, for example, a digital signal which is produced by sampling an analog signal at a sampling frequency f. The analog signal may be a speech signal. The received signal is received as an input signal at the input terminal 12 through the hybrid circuit 14.

The echo canceller 11 comprises first through (N−1)-th delay circuits (D) 20-1 to 20-(N−1), where N represents a positive integer which is not less than one. Each of the first through the (N−1)-th delay circuits 20-1 to 20-(N−1) gives a delay of a predetermined time (1/f) to a signal supplied thereto. The first through the (N−1)-th delay circuits 20-1 to 20-(N−1) produces first through (N−1)-th delayed signal, respectively. In the illustrated example, the input side of the first delay circuit 20-1 is defined as a first tap 21-1. The output sides of the first through the (N−1)-th delay circuits 20-1 to 20-(N−1) are defined as second through N-th taps 21-2 to 21-N, respectively.

Each of the first through the N-th taps 21-1 to 21-N is connected to a switch circuit 22. The switch circuit 22 selects selected ones of the first through the N-th taps 21-1 to 21-N as first through K-th selected taps in accordance with a tap select signal which is supplied from a tap control circuit 23, where K represents a positive integer which is less than the positive integer N.

The first through the K-th selected taps are connected to first through K-th filter multipliers 24-1 to 24-K and first through K-th tap gain producing circuits 25-1 to 25-K by the switch circuit 22, respectively. As a result, selected ones of the received signal and the first through the (N−1)-th delayed signals are supplied as first through K-th selected signals to the first through the K-th filter multipliers 24-1 to 24-K and the first through the K-th tap gain producing circuits 25-1 to 25-K, respectively.

The first tap gain producing circuit 25-1 produces a first controllable tap gain W1 in accordance with the first selected signal and an error signal which will later be described. Similarly, the second through the K-th tap gain producing circuits 25-2 to 25-K produce second through K-th controllable tap gains W2 to WK in accordance with the second through the K-th selected signals and the error signal, respectively.

Supplied with the first controllable tap gain W1 in the manner which will presently be described, the first multiplier 24-1 multiplies the first selected signal by the first controllable tap gain W1 to supply a first multiplied signal to a filter adder 26. The second through the K-th filter multipliers 24-2 to 24-K multiply the second through the K-th selected signals by the second through the K-th controllable tap gains W2 to WK to supply second through K-th multiplied signals to the filter adder 26, respectively.

The filter adder 26 calculates a total sum of the first through the K-th multiplied signals to supply the total sum as a filtered signal to a filter subtracter 27. Supplied with the input signal from the input terminal 12, the filter subtracter 27 subtracts the filtered signal from the input signal to deliver the error signal to the output terminal and first through the K-th tap gain producing circuits 25-1 to 25-K.

Figure 2:
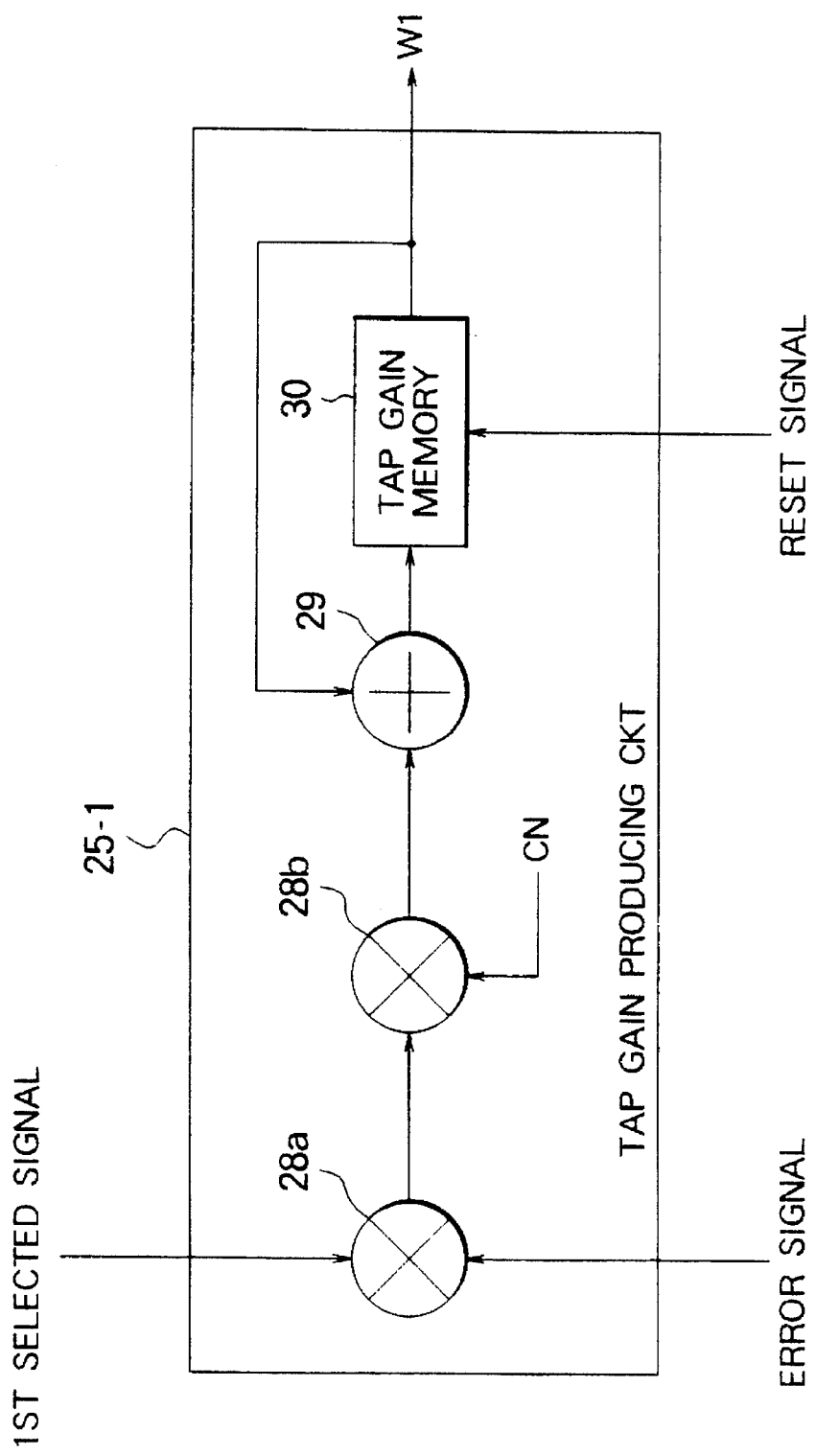
FIG. 2 is a block diagram of a tap gain producing circuit illustrated in FIG. 1.

Referring to FIG. 2, attention will be directed to the first tap gain producing circuit 25-1. The first tap gain producing circuit 25-1 comprises first and second tap gain multipliers 28a and 28b, a tap gain adder 29, and a tap gain memory circuit 30. Supplied with the first selected signal and the error signal, the first tap gain multiplier 28a multiplies the first selected signal and the error signal to supply a first tap gain signal to the second tap gain multiplier 28b. The second tap gain multiplier 28b multiplies the first tap gain signal by a predetermined gain value (a predetermined coefficient) CN to supply a second tap gain signal to the tap gain adder 29.

The tap gain memory circuit 30 memorizes the first controllable tap gain W1 to deliver the first controllable tap gain W1 to the first filter multiplier 24-1 (FIG. 1). The first controllable tap gain W1 is further supplied to the tap gain adder 29. The tap gain adder 29 calculates a sum of the second tap gain signal and the first controllable tap gain W1 to supply the sum as a sum tap gain to the tap gain memory circuit 30. The tap gain memory circuit 30 memorizes the sum tap gain as the first controllable tap gain W1. When supplied with a reset signal which is supplied from the tap control circuit 23 (FIG. 1), the tap gain memory circuit 30 makes the first controllable tap gain W1 be zero.

Although description is made as regards the first tap gain producing circuit 25-1 with reference to FIG. 2, each of the second through the K-th tap gain producing circuits 25-2 to 25-K is similar in structure to the first tap gain producing circuit 25-1.

Again referring to FIG. 1, attention will be directed to the tap control circuit 23. The tap control circuit 23 comprises a tap group memory circuit 31 for memorizing groups numbers of first through M-th tap groups as first through M-th tap group numbers, respectively, where M represents a positive integer which is less than the positive integer N. Each of the first through the N-th taps 21-1 to 21-N belongs to either one of the first through M-th tap groups. More specifically, the taps are equal in number to one another in each of the first through the M-th tap groups. Furthermore, the tap numbers are successive in each of the first through the M-th tap groups.

It will be assumed that the positive integer N is equal to twenty and the positive integer M is equal to five. The total number of the taps is equal to four in each of the first through the M-th tap groups. More particularly, the first through the fourth taps belong to the first tap group. The fifth through the eighth taps belong to the second tap group. The ninth through the twelfth taps belong to the third tap group. The thirteenth through sixteenth taps belong to the fourth tap group. The seventeenth through twentieth taps belong to the fifth tap group. At an initial state, the tap group memory circuit 31 may memorize the first through the fifth tap group numbers in an ascending order of the first through the fifth tap group numbers.

The tap control circuit 23 further comprises an inactive tap memory circuit 32 for memorizing inactive tap numbers as first through (N−K)-th inactive tap numbers in first-in-first-out queue. Each of the first through the K-th selected taps may be called an active tap and each of remaining taps will be called an inactive tap.

The inactive tap numbers are determined at the initial state to be sent from the tap group memory circuit 31 to a tap number producing circuit 33. The tap number producing circuit 33 has numbers of first through the N-th taps as total tap numbers and calculates active tap numbers on the basis of the inactive tap numbers and the total tap numbers to supply the switch circuit 22 with a tap select signal representative of the active tap numbers. As described above, the switch circuit 22 selects the selected ones of the first through the N-th taps as the first through the K-th selected taps in accordance with the tap select signal. By the switch circuit 22, the first through the K-th selected taps are connected to first through K-th filter multipliers 24-1 to 24-K and the first through the K-th tap gain producing circuits 25-1 to 25-K, respectively.

At the initial state, the taps each of which has a small tap number are successively selected as the first through the K-th selected taps. It will be assumed that the positive number N is equal to twenty and the positive integer K is equal to three. At the initial state, each of the first through the third taps is selected as the active tap. The number of each of the fourth through the twentieth taps is memorized as the inactive tap number in an ascending order in the inactive tap memory circuit.

The first through the K-th controllable tap gains W1 to WK are supplied to a minimum tap gain detecting circuit 34 and a maximum tap gain detecting circuit 35. Furthermore, the tap select signal is supplied to the minimum tap gain detecting circuit 34 and the maximum tap gain detecting circuit 35.

The minimum tap gain detecting circuit 34 calculates absolute values of the first through the K-th controllable tap gains as first through K-th absolute values to detect a minimum absolute value among the first through the K-th absolute values as a detected minimum absolute value. On the basis of the tap select signal, the minimum tap gain detecting circuit 34 searches the active tap number corresponding to the detected absolute minimum value as a minimum active tap number to produce an active tap signal representative of the minimum active tap number. The active tap signal is supplied from the minimum tap gain detecting circuit 34 to the inactive tap memory circuit 32 and a reset circuit 36.

Responsive to the active tap signal, the reset circuit 36 supplies the reset signal to the tap gain producing circuit connected to the active tap having the minimum active tap number. As a result, the controllable tap gain becomes zero in the tap gain producing circuit connected to the active tap having the minimum active tap number.

Supplied with the active tap signal, the inactive tap memory circuit 32 memorizes the minimum active tap number as the inactive tap number at the tail of the queue. The inactive tap memory circuit 32 supplies the inactive tap number of the top of the queue as a read tap number to a judging circuit 37.

As described above, the first tap group number is supplied from the tap group memory circuit 31 to a control tap producing circuit 38 at the initial state. Supplied with the first tap group number, the control tap producing circuit 38 searches a minimum tap having a minimum tap number and a maximum tap number having a maximum tap number among the first tap group to supply the minimum tap number and the maximum tap number to the judging circuit 37. The judging circuit 37 judges whether or not the read tap number is between the maximum tap number and the minimum tap number (both inclusive).

When the read tap number is not between the maximum tap number and the minimum tap number, the judging circuit 37 returns the read tap number back to the inactive tap memory circuit 32. The inactive tap memory circuit 32 memorizes the read tap number as the inactive tap number at the tail of the queue. The inactive tap memory circuit 32 again supplies the judging circuit 37 with the inactive tap number of the top of the queue as the read tap number.

When the read tap number is between the maximum tap number and the minimum tap number, the inactive numbers memorized in the inactive tap memory circuit 32 are supplied as renewal inactive tap numbers from the inactive tap memory circuit 32 to the tap number producing circuit 33 under control of the judging circuit 37. The tap number producing circuit 33 produces the tap select signal in accordance with the renewal inactive tap numbers to supply the tap select signal to the switch circuit 22. The switch circuit 22 selects the selected ones of the first through the N-th taps as the first through the K-th selected taps in accordance with the tap select signal as described above.

As described above, the maximum tap gain detecting circuit 35 is supplied with the first through the K-th controllable tap gains W1 to WK and the tap select signal. At the initial state, it is to be noted that the maximum tap gain detecting circuit 35 previously stores therein, as group tap numbers, the tap numbers which belong to each of the first through the M-th tap groups. The maximum tap gain detecting circuit 35 knows the active taps in each of the first through the M-th tap groups in accordance with the group tap numbers and the tap select signal which is representative of the active tap numbers as described above. The maximum tap gain detecting circuit 35 detects the controllable tap gain having a maximum absolute value as a maximum tap gain every first through the M-th tap groups to produce first through M-th maximum tap gains.

The first through the M-th maximum tap gains are supplied from the maximum tap gain detecting circuit 35 to a first counter circuit 39. Furthermore, the maximum tap gain detecting circuit 35 supplies a tap group renewal circuit 40 with a tap group order signal which is representative of tap group numbers arranged in a descending order of the absolute value.

The first counter circuit 39 counts each of the first through the M-th maximum tap gains. First through M-th counts are determined in the first counter circuit 39 at first through the M-th maximum tap gains, respectively. Whenever the first counter circuit 39 counts each of the first through the M-th counts, the first counter circuit 39 supplies a tap group renewal signal to the tap group memory circuit 31 and the second counter 41.

Supplied with the tap group renewal signal, a next tap group number is read out of the tap group memory circuit 31 to be supplied as a read tap group number to the control tap producing circuit 38. In case where the first tap group number is supplied from the tap group memory circuit 31 to the control tap producing circuit 38 before the tap group renewal signal is supplied from the first counter circuit 39 to the tap group memory circuit 31, the tap group memory circuit 31 supplies the second tap group number to the control tap producing circuit 38 in response to the tap group renewal signal.

The second counter circuit 41 counts the tap group renewal signal. When the count of the tap group renewal signal is coincident with the positive integer M, the second counter circuit 41 produces a count-up signal to supply the count-up signal to tap group renewal circuit 40. Responsive to the count-up signal, the tap group renewal circuit 40 accesses the tap group memory circuit 31 to renew the content of the tap group memory circuit 31. More specifically, the tap group renewal circuit 40 changes the order of first through the M-th tap groups on the basis of the tap group order signal to produce a varied order. The varied order is written as a renewal order in the tap group memory circuit 31 instead of the initial order.

As readily understood from the above description, it is possible to filter the received signal into the filtered signal as desired in the echo canceller 11. Furthermore, it is possible to remove a multi-echo in the echo canceller 11 because active taps are gradually moved over the total taps.

However, it is necessary to calculate first through the M-th maximum tap gains in the echo canceller 11 whenever renewal is carried out in the order of the first through the M-th tap groups. As a result, calculating load increases in the echo canceller 11. It is difficult to remove residual echo at a rapid speed in the echo canceller 11.

Figure 3:
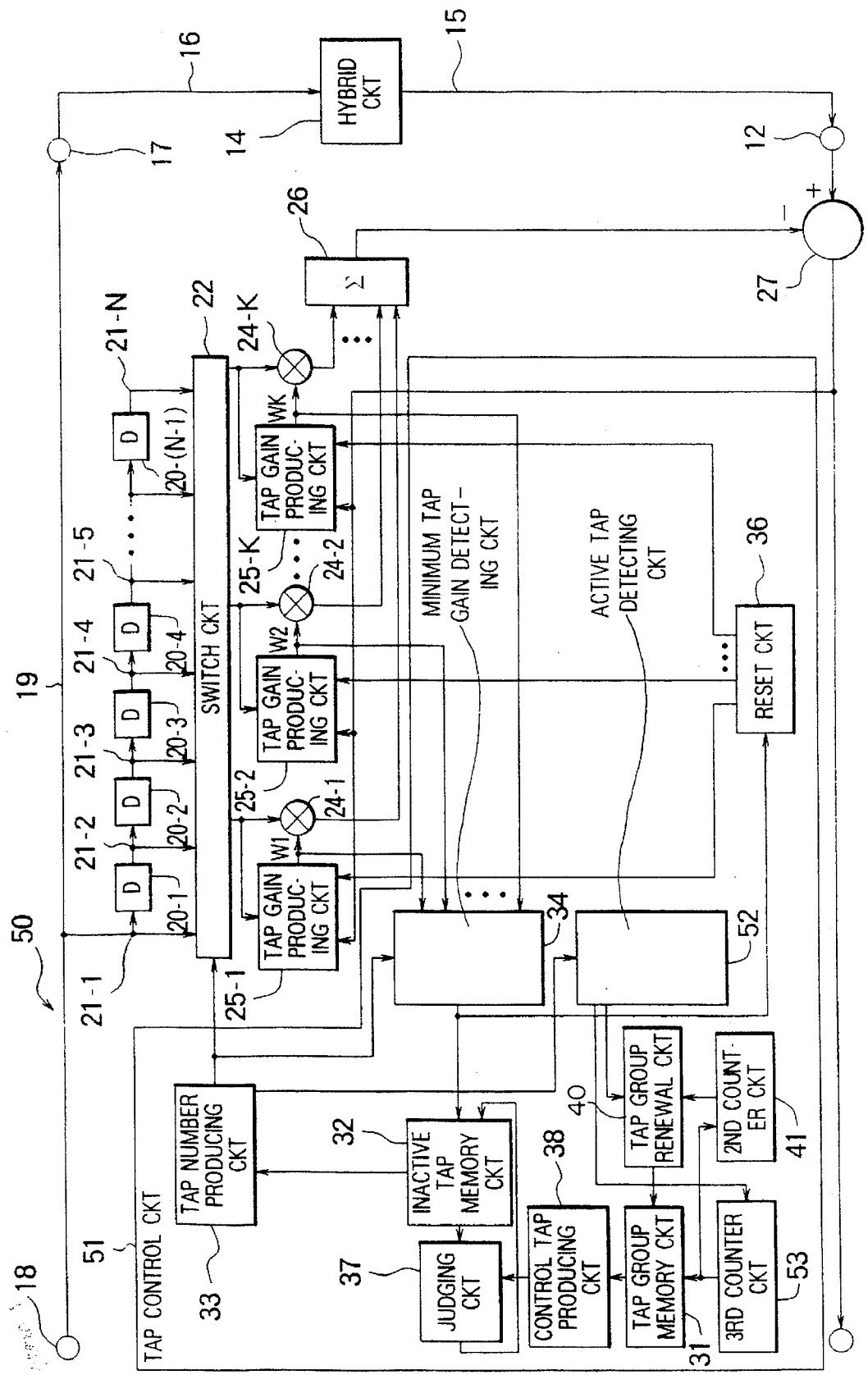
FIG. 3 is a block diagram of an adaptive filter according to a preferred embodiment of this invention.

Referring to FIG. 3, description will proceed to an echo canceller according to a preferred embodiment of this invention. The illustrated echo canceller is different in structure from the echo canceller 11 illustrated in FIG. 1 and is therefore designated afresh by a reference numeral 50. The echo canceller 50 comprises similar parts which are designated by like reference numerals and are operable with likewise named and denoted signals.

The echo canceller 50 comprises a tap control circuit 51 which is different in structure from the tap control circuit 23 described with reference to FIG. 1. More particularly, the tap control circuit 51 comprises an active tap detecting circuit 52 and a third counter circuit 53 instead of the maximum tap gain detecting circuit 35 and the first counter circuit 39 illustrated in FIG. 1. Remaining parts are similar to those of the tap control circuit 23 in the tap control circuit 51.

The active tap detecting circuit 52 previously stores therein, as the group tap numbers, the tap numbers which belong to each of the first through the M-th tap groups. Supplied with the tap select signal, the active tap detecting circuit 52 detects as first through M-th active tap values the number of the active taps in each of the first through the M-th tap groups. The first through the M-th active tap values are supplied as the first through the M-th number signals from the active tap detecting circuit 52 to the third counter circuit 53. Furthermore, the active tap detecting circuit 52 supplies the tap renewal circuit 40 with a tap group order signal which is representative of tap group numbers arranged in a descending order of the number of the active taps.

The third counter circuit 53 counts up every first through the M-th number signals. More particularly, the third counter circuit 53 counts each of the first through the M-th number signals. First through M-th counts are determined in the third counter circuit 53 at the first through the M-th number signals, respectively. Whenever the third counter circuit 53 counts each of the first through the M-th counts, the third counter circuit 53 supplies the tap group renewal signal to the tap group memory circuit 31 and the second counter circuit 41.

Now, it will be assumed that the positive integer N is equal to thirty and the positive integer K is equal to ten. Furthermore, it will be assumed that the positive integer M is equal to five. The number of the taps becomes six in each of the first through the fifth tap groups. More specifically, first through sixth taps belong to the first tap group. The seventh through the twelfth taps belong to the second tap group. The 13th through the 18th taps belong to the third tap group. The 19th through 24th taps belong to the fourth tap group. The 25th through the 30th taps belong to the fifth tap group.

It will be presumed that each of the first, the seventh, the eighth, the ninth, the tenth, the 16th, the 17th, the 20th, the 21th, and the 22th taps is the active tap just before the second counter circuit 41 supplies the tap renewal signal to the tap group renewal circuit 40. In this condition, the number of the active taps is equal to one in the first tap group. The number of the active taps is equal to four in the second tap group. The number of the active taps is equal to two in the third tap group. The number of the active taps is equal to three in the fourth tap group. The number of the active taps is equal to zero in the fifth tap group.

Under the circumstances, each of the first through the fifth tap groups is used as an active tap group at a renewal frequency or number T(i), where i is a positive integer between one and five (both inclusive). When the number of the active taps is given by NUM(i) in each of the first through the fifth tap groups, the renewal frequency is given by:

$$T(i)=NUM(i) \times 100+10$$

The renewal frequencies of the first through the fifth tap groups will be called first through fifth renewal frequencies, respectively. The first renewal frequency T(1) is equal to one hundred and ten. The second renewal frequency T(2) is equal to four hundred and ten. The third renewal frequency T(3) is equal to two hundred and ten. The fourth renewal frequency T(4) is equal to three hundred and ten. The fifth renewal frequency T(5) is equal to ten.

When a renewal order among first through the fifth tap groups is obtained on the basis of the order of the number of the active taps, the first tap group has the active taps of one as described above. The second tap group has the active taps of four. The third tap group has the active taps of two. The fourth tap group has the active taps of three. The fifth tap group has the active taps of zero. Accordingly, the renewal order becomes an order of the second tap group, the fourth tap group, third tap group, the first tap group, and the fifth tap group.

As readily understood from the above description, calculating load decreases in the echo canceller 50 inasmuch as the renewal order of the first through the M-th tap groups is produced on the basis only the tap select signal, namely, the number of the active taps.

What is claimed is:

1. An adaptive filter comprising first through N-th taps, where N represents a positive integer which is not less than one, filter means for filtering a received signal into a filtered signal in accordance with first through K-th controllable tap gains, where K represents a positive integer which is less than the positive integer N, tap selecting means for selecting selected ones of said first through said N-th taps as first through K-th selected taps in accordance with a tap select signal to connect said first through said K-th selected taps to said filter means, and producing means for producing said tap select signal in accordance with said first through said K-th controllable tap gains, wherein:

each of said first through said N-th taps belongs to either one of first through M-th tap groups, where M represents a positive integer which is less than the positive integer N;

said producing means comprising:
first generating means for generating a specific one of said first through said M-th tap groups;
second generating means for generating said tap select signal in accordance with said first through said K-th controllable tap gains and said specific tap group; and
control means responsive to said tap select signal for controlling said first generating means to make said first generating means generate a renewal one of said first through said M-th tap groups as said specific tap group.

2. An adaptive filter as claimed in claim 1, wherein said first generating means comprises tap group memory means for memorizing first through M-th tap group numbers which is representative of said first through said M-th tap groups, respectively, said tap group memory means producing a specific one of said first through said M-th tap group numbers to inform said second generating means of said specific tap group.

3. An adaptive filter as claimed in claim 2, remaining taps except said first through said K-th selected taps being defined as first through (N-K)-th inactive taps having first through (N-K)-th inactive tap numbers, respectively, wherein said second generating means comprises:

tap select signal generating means for generating said tap select signal on the basis of said first through said (N-K)-th inactive tap numbers; and inactive tap renewal means supplied with said specific tap group number, said tap select signal, and said first through said K-th controllable tap gains for renewing said first through said (N-K)-th inactive tap numbers into first through (N-K)-th renewal inactive tap numbers to supply said tap select signal generating means with said first through said (N-K)-th renewal inactive tap numbers as said first through said (N-K)-th inactive tap numbers.

4. An adaptive filter as claimed in claim 3, wherein said inactive tap renewal means comprises:

first detecting means supplied with said tap select signal and said first through said K-th controllable tap gains for detecting a tap gain having a minimum absolute value as a minimum tap gain, said detecting means producing a tap number corresponding to said minimum tap gain as a minimum tap number;

inactive tap memory means for memorizing said first through said (N-K)-th inactive tap numbers in a queue, said inactive tap memory means memorizing said minimum tap number as said (N-K)-th inactive tap number to produce said first inactive tap number as a read tap number; and determining means for determining said first through said (N-K)-th renewal inactive tap number when said read tap number is a number among a predetermined range.

5. An adaptive filter as claimed in claim 4, wherein said determining means comprises:

second detecting means supplied with said specific tap group number for detecting maximum and minimum tap numbers among tap numbers which belong to said specific tap; and judging means for judging whether or not said read tap number is a number among said predetermined range defined by said maximum and said minimum tap numbers, said judging means determining said first through said said (N-K)-th renewal inactive tap number when said read tap number is the number among said predetermined range defined by said maximum and said minimum tap numbers.

6. An adaptive filter as claimed in claim 5, wherein said adaptive filter further comprising reset means for resetting the controllable tap gain corresponding to said minimum tap number to an initial value.

7. An adaptive filter as claimed in claim 1, wherein said control means comprises:

detecting means supplied with said tap select signal for detecting that each of said first through said K-th selected taps belongs to either one of said first through said M-th tap groups to produce the number of selected taps every said first through said M-th tap groups as first through M-th tap values;

primary counter means supplied with said first through said M-th tap values for counting said first through said M-th tap values to produce first through M-th counts, respectively, said primary counter means supplying a primary renewal signal to said first generating means whenever said first through said M-th counts reaches to first through M-th predetermined values, respectively; and said first generating means responsive to said primary renewal signal for generating said renewal tap number.

8. An adaptive filter as claimed in claim 7, wherein said control means further comprises:

secondary counter means for counting said primary renewal signal to obtain a count, said secondary counter means producing a count-up signal when said count reaches to a predetermined count; and order renewal means responsive to said count-up signal for renewing an order of said first through said M-th tap groups into a renewal order in accordance with said first through said M-th tap values.

9. An adaptive filter as claimed in claim 8, wherein said predetermined count is equal to the positive integer M.

10. An adaptive filter as claimed in claim 8, wherein said renewal order is an order of large values among said first through said M-th tap values.

* * * * *